(12) United States Patent
Knotter et al.

(10) Patent No.: US 8,282,845 B2
(45) Date of Patent: Oct. 9, 2012

(54) ETCHING WITH IMPROVED CONTROL OF CRITICAL FEATURE DIMENSIONS AT THE BOTTOM OF THICK LAYERS

(75) Inventors: Dirk Marteen Knotter, Nijmegen (NL); Arnoldus Den Dekker, Beuningen (NL); Ronald Koster, Wijchen (NL); Robertus T. F. Van Schaijk, Eindhoven (NL)

(73) Assignee: EPCOS AG, Munich (DE)

( * ) Notice: Subject to any disclaimer, the term of this patent is extended or adjusted under 35 U.S.C. 154(b) by 614 days.

(21) Appl. No.: 12/496,748

(22) Filed: Jul. 2, 2009

(65) Prior Publication Data
US 2009/0298293 A1 Dec. 3, 2009

Related U.S. Application Data

(63) Continuation of application No. PCT/IB2007/055353, filed on Dec. 31, 2007.

(30) Foreign Application Priority Data

Jan. 5, 2007 (EP) .................................... 07100166

(51) Int. Cl.
*C03C 15/00* (2006.01)
(52) U.S. Cl. .......................................... 216/41; 438/743

(58) Field of Classification Search ........................ None
See application file for complete search history.

(56) References Cited

U.S. PATENT DOCUMENTS

| | | | | |
|---|---|---|---|---|
| 5,783,496 | A | * | 7/1998 | Flanner et al. ................ 438/743 |
| 6,297,163 | B1 | * | 10/2001 | Zhu et al. ..................... 438/707 |
| 2005/0068608 | A1 | | 3/2005 | Campbell et al. |
| 2005/0098855 | A1 | * | 5/2005 | Shimoji et al. ................ 257/621 |

* cited by examiner

*Primary Examiner* — Binh X Tran
*Assistant Examiner* — David Cathey, Jr.
(74) *Attorney, Agent, or Firm* — Slater & Matsil, L.L.P.

(57) ABSTRACT

The present invention relates to a method for etching a feature in an etch layer that has a thickness of more than 2 micrometers from an initial contact face for the etchant to an opposite bottom face of the etch layer, at a lateral feature position in the etch layer and with a critical lateral extension at the bottom face. The method includes fabricating, at the lateral feature position on the substrate layer, a mask feature from a mask-layer material, the mask feature having the critical lateral extension. The etch layer is deposited to a thickness of more than 2 micrometers, on the mask feature and on the substrate layer, from an etch-layer material, which is selectively etchable relative to the mask-layer material. Then, the feature is etched in the etch layer at the first lateral position with a lateral extension larger than the critical lateral extension, using an etchant that selectively removes the etch layer-material relative to the mask-layer material.

20 Claims, 5 Drawing Sheets

ETCHING WITH IMPROVED CONTROL OF CRITICAL FEATURE DIMENSIONS AT THE BOTTOM OF THICK LAYERS

This application is a continuation of co-pending International Application No. PCT/IB2007/055353, filed Dec. 31, 2007, which designated the United States and was published in English, and which claims priority to European Application No. 07100166.3 filed Jan. 5, 2007, both of which applications are incorporated herein by reference.

TECHNICAL FIELD

A method is provided for etching a feature in an etch layer that has a thickness of more than 2 micrometer, the feature having a lateral feature position in the etch layer and a critical lateral extension at an interface between the etch layer and a substrate layer.

BACKGROUND

U.S. Patent Application Publication 2005/0068608 describes a process for selectively etching an etch layer in the form of a material layer. The process is used in the fabrication of microelectro-mechanical system (MEMS) devices. Features etched in the form of a via are fabricated in a layer structure of sub-micrometer thickness.

However, when etching thick layers with a thickness of more than 2 micrometers with a plasma etching process or a wet etching process, the control over critical lateral extensions at the bottom of the etch layer, i.e., at the interface between the etch layer and the substrate, is reduced. As a consequence, the mentioned critical lateral extension of the feature is observed to vary over a single wafer and also from wafer to wafer.

This problem can be very critical in the production of MEMS structures. For instance, the critical lateral extension may be a diameter of holes formed in a metal beam that is located above an electrode in a MEMS device. The metal beam can be moved to vary its distance from the electrode. In this example configuration, the capacity between the metal beam and the bottom electrode depends, among others, on the surface area on the bottom face of the metal beam, which faces the electrode. The surface area of the bottom face of the metal beam depends on the area of the holes that are provided as features with a critical lateral extension at the bottom face of the metal beam. Therefore, variations in the size of the holes at the bottom face of the metal beam are responsible for variations in the capacity of the MEMS device of this illustrative example.

SUMMARY OF THE INVENTION

Embodiments of the present invention improve the control of a critical lateral extension at an interface between a thick etch layer and underlying substrate layer.

According to a first embodiment, a method is provided for etching a feature in an etch layer that has a thickness of more than 2 micrometers from an initial contact face for an etchant to an opposite bottom face of the etch layer. The method is for etching the feature with a critical lateral extension at the bottom face of the etch layer and at a lateral feature position.

In one embodiment, a mask feature is fabricated from a mask-layer material. The mask feature is fabricated at the lateral feature position on a substrate layer and has a critical lateral extension. An etch layer is deposited from an etch layer material on the mask feature and on the substrate layer. The etch layer is deposited to a thickness of more than 2 micrometers from an initial contact face and is selectively etchable relative to the mask-layer material. A feature is etched in the etch layer at the first lateral position with a lateral extension larger than the critical lateral extension. The etching uses an etchant that selectively removes the etch layer material relative to the mask layer material.

The method of embodiments of the invention allows fabricating the feature in the etch layer with a critical lateral extension at the bottom face of the etch layer with a particularly high accuracy and insensitivity to process variations during the etching step. The critical lateral extension of the feature at the bottom face is accurately reproduced for features on a single wafer and for features on different wafers. The term "etch layer" is used herein to denote a layer that is etched for fabricating the feature. There is no further restriction implied in the name "etch layer" for this layer.

The term "feature" is used here to denote a variety of structures that can be fabricated by etching. On the one hand, such structures are for instance vias or holes, or trenches. On the other hand, features can also take the form of elevated structures on the substrate layer, such as pillars or lines, plates, or the like. Also combinations of aforementioned structures are possible, such as perforated plates.

The term "substrate layer" is used with a general meaning to refer to any kind of substrate, on which the mask feature is deposited. The substrate layer can take the form of a wafer, or a layer that was previously deposited on a wafer. The substrate layer can also be a sacrificial substrate that is removed during later processing stages.

The critical lateral extension of the feature at the bottom face is denoted as such to indicate that control of this lateral extension is of particular importance. The critical lateral extension may be a lateral extension that is particularly small and close to a resolution limit of an employed processing technology. However, this case is to be understood as one embodiment among a plurality of embodiments. In general, the term "critical lateral extension" does not imply that the lateral extension of the feature under consideration at the bottom face of the etch layer must be close to the resolution limit of an employed technology. Within the context of the method of the present invention the critical lateral extension of the feature in the etch layer is the lateral extension, for which the method provides improved accuracy and reproducibility.

The processing has the advantage of rendering the limited accuracy and reproducibility of the etching process in the thick etch layer virtually irrelevant for achieving the desired higher accuracy and reproducibility in the critical lateral extension of the feature to be etched.

In the following, embodiments of the method of the invention will be described. Unless stated otherwise, the embodiments can be combined with each other.

The invention is based on the concept of defining the critical lateral extension of the feature to be etched by means of a mask feature. The mask feature preferably has a reduced thickness in comparison with the etch layer. The thickness of the mask feature is defined by the requirement that it allows reproducibly producing the mask feature with the critical lateral extension from a mask layer with a conventional patterning technique. The particular thickness value for the mask feature depends on processing conditions, such as material choices, etching process, etc. However, finding the right thickness of the mask feature for desired high accuracy and reproducibility is only a matter of testing different thickness values for the mask feature under the desired processing conditions. In some embodiments, the thickness of the mask feature amounts to 20% or less of the total layer thickness. The total layer thickness is the sum of the thickness values of the etch layer and of the mask layer. However, in other embodiments, the thickness of the mask feature is higher than 20% of the total layer thickness. Typically, the mask layer has a thickness of less than 50% of the total layer thickness.

In some embodiments, the step of fabricating the mask feature comprises fabricating a mask opening in a mask layer on the substrate layer at the lateral feature position and with the critical lateral extension. This embodiment is suitable for fabricating features in the form of vias or holes or trenches in the etch layer. The present embodiment typically comprises depositing the mask layer on the substrate layer. However, the mask layer is in another embodiment provided as part of a prefabricated substrate.

One useful embodiment employs a mask layer that is made of TiW and an etch layer that is made of Al. This material combination of the mask layer and the etch layer provides the required selectivity during the step of etching the feature in the etch layer. Al can be etched selectively with respect to TiW by employing as an etchant for instance an aqueous solution of $H_3PO_4/HNO_3$. This embodiment has the benefit that the TiW mask layer also provides protection against surface roughening at the bottom face of the Al etch layer if the substrate layer is later on removed, for instance by under-etching. Note that it is possible that the etch layer and the mask layer are of the same material, for example, of Al. A natural oxide layer on the Al mask feature forms an etch barrier in this case if the Al etch layer is etched in an isotropic chlorine based plasma etch.

In a further embodiment that makes use of fabricating a mask opening in a mask layer on the substrate layer, the following additional processing is performed:

fabricating the mask feature comprises fabricating a sacrificial etch-stop cap from an etch-stop material in the mask opening, the etch-stop material being selectively etchable relative to the mask-layer material and the etch-layer material;

the etch-layer material is additionally selectively etchable relative to the etch-stop material; and etching the feature in the etch layer comprises a first selective etching step, in which the etch layer is removed selectively relative to the etch-stop cap, and a second selective etching step, in which the etch-stop cap is removed selectively relative to the etch layer and to the mask layer.

The present embodiment of the invention has the advantage that it allows the use of identical materials for the etch-layer and the mask-layer. This avoids problems of the use of two different metals for the etch-layer and the mask-layer. If used in a mechanical device, such two different metals could result in an undesired bi-metallic effect. As is well known, a layer structure of different metals, which have different rates of thermal expansion at increasing temperatures leads to stress, which typically results in a deformation of the layer structure. This effect can be avoided with the present embodiment. The sacrificial mask cap that is employed at an intermediate stage of this embodiment to cover the mask opening forms an etch stop for the etchant during the first selective etching step.

In one form of this embodiment, the etch-layer (and mask-layer) material is a metal, and the etch-stop material of the etch-stop cap is non-metallic. A suitable material combination is for instance the use of Al for the etch-layer and the mask-layer, and the use of $SiO_2$ for the etch-stop cap.

In this example, it is advantageous to fabricate the etch-stop cap in the shape of the capital letter T. The vertical bar of the "T" fills the mask opening. The horizontal bar covers sections of the mask layer. Without the protection by the horizontal T-bar sections of the etch-stop cap, the mask layer sections underneath could be attacked in the etching of the etch-layer. This example is useful not only for the case of Al as a common material for the mask and etch layers, but for any material and process choice, in which the etch layer material is not selectively etched with respect to the mask layer material and the etch-stop material at the same time.

In one of two alternative forms of this embodiment, the etch-stop material is not selectively etchable relative to the substrate layer. This relaxes material requirements, if the substrate layer is a sacrificial layer that will be removed during the following processing. In this case, selectivity is not necessary because the substrate layer might advantageously be etched in the same etching step as the etch-stop layer. In the other of the two alternative forms of this embodiment, however, the etch-stop material is selectively etchable relative to the substrate layer.

While the previously described embodiments made use of a mask layer to form a mask opening of the critical lateral extension therein, an alternative embodiment comprises in the step of fabricating the mask feature a step of depositing a mask layer from a mask-layer material on the substrate layer. It further comprises removing those mask-layer sections, which are arranged outside the critical lateral extension at the lateral feature position. In this embodiment, etching the feature in the etch layer comprises a first selective etching step, in which the etch layer is removed selectively relative to the mask feature, and a second selective etching step, in which the mask feature is removed selectively relative to the etch layer. Note for consistency of terminology that in the present embodiment the mask-feature material is the same as the mask-layer material because the mask feature is an elevated structure that is formed from the mask layer.

The present embodiment has the advantage over the previous embodiment, which made use of a sacrificial mask cap, that no lithographic processing is required for fabricating the mask cap on the mask layer. Therefore, one lithographic mask step (i.e., resist deposition, providing a lithographic mask, mask exposure, resist development, resist patterning, layer deposition, resist strip) can be saved. Still, the critical lateral extension is fabricated with good reliability and without having to rely on a layer structure of two layers in the final structure. The mask feature in the present embodiment is a sacrificial mask feature as well and is removed in the second selective etching step. An example of a suitable material combination for the etch-layer and the mask layer is again Al (etch-layer) and $SiO_2$ (mask feature). Other material combinations are possible and will be described further below.

In some embodiments, the step of fabricating the mask feature comprises depositing a mask layer on the substrate layer and structuring the mask layer with a lithographic process to form the mask feature.

BRIEF DESCRIPTION OF THE DRAWINGS

The invention will now be explained in more detail with reference to the drawings in which.

DETAILED DESCRIPTION OF ILLUSTRATIVE EMBODIMENTS

Figure 1:
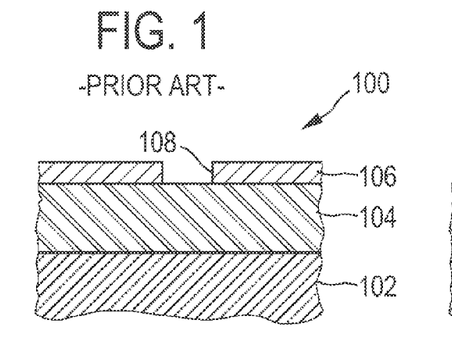
FIGS. 1 and 2 show a first example of a layer structure in a cross-sectional view at two different stages during the fabrication of a feature by etching according to the prior art.
Figure 2:
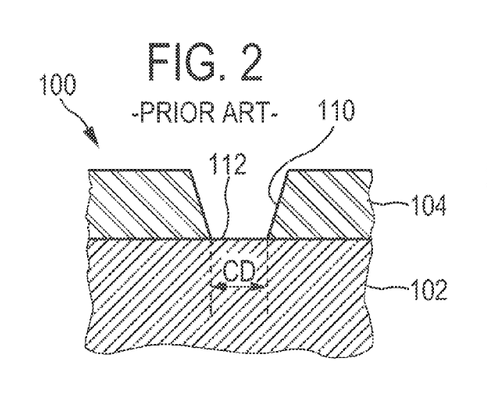
Figure 3:
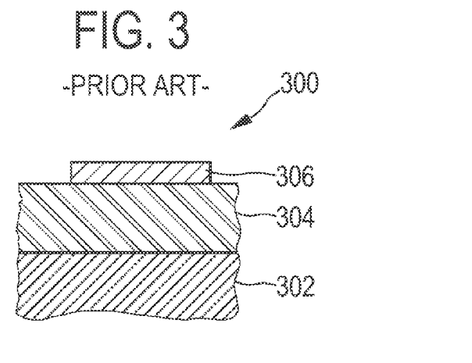
FIGS. 3 and 4 show a second example of a layer structure in a cross-sectional view at two different stages during the fabrication of a feature by etching according to the prior art.
Figure 4:
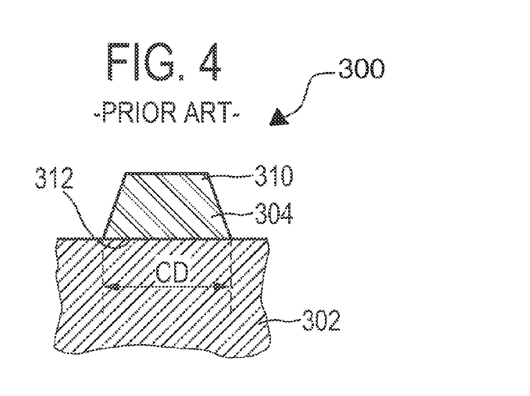

In the following, FIGS. 1 to 4 will be referred to in parallel. FIGS. 1 and 2 show a first example of a layer structure 100 in a cross-sectional view at two different stages during the fabrication of a feature by etching according to the prior art. FIGS. 3 and 4 show a second example of a layer structure 300 in a cross-sectional view at two different stages during the fabrication of a feature by etching according to the prior art.

The layer structure 100 shown in FIG. 1 comprises a wafer 102, an etch layer 104, and a resist layer 106, that has been patterned by means of a photolithographic technique. The patterning has resulted in an opening 108 at a predefined lateral position and with a critical lateral extension CD, that is indicated in FIG. 2. The etch layer 104 has a thickness that is larger than 2 micrometers. A feature 110 in the form of a via is then etched through the opening 108 by a plasma etch process or a wet etch process. The via reaches from the top face to the bottom face of the etch layer 104, and thus has an extension larger than 2 micrometers. The shape of the via resembles that of a funnel, as is typical for plasma or wet etch processes in layers of a thickness of more than 2 micrometers.

The layer structure 300 shown in FIG. 3 comprises a substrate 302, an etch layer 304 and a resist layer 306, that has been patterned by means of a photolithographic technique. The patterning has resulted in an elevated resist layer segment 312 at a predefined lateral position and with a critical lateral extension CD, that is indicated in FIG. 4. The etch layer 304 has a thickness that is larger than 2 micrometers. A feature 310 in the form of a line is then etched with the aid of the resist layer segment 308 by a plasma etch process or a wet etch process. The cross section of the line 310 has the shape of an inverted funnel in the sectional view of FIG. 4.

The etching processes described with reference to FIGS. 1 to 4 have the problem that control of the critical lateral extension CD of the features degrades with increasing thickness. Different features on the same wafer are fabricated with undesired different critical lateral extensions. Also, different features on different wafers have undesired different critical lateral extensions CD. The differences between the critical extensions CD result from a non-uniformity of the etch process employed. Such non-uniformity increases when the thickness of the layers to be etched increases. In the production of MEMS structures, this problem can be very critical.

Figure 5:
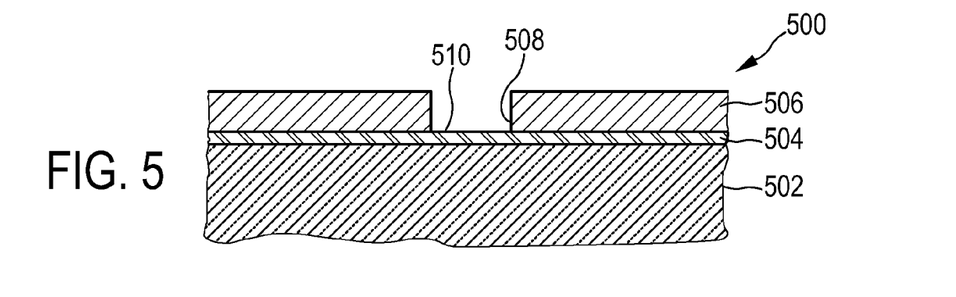
FIGS. 5 to 8 show a first embodiment of an etching method by cross-sectional views of a layer structure during different processing stages.

FIGS. 5 to 8 show a first embodiment of an etching method by cross-sectional views of a layer structure 500 during different processing stages. As is shown in FIG. 5, the layer structure 500 comprises a substrate layer, for instance a silicon wafer 502, a mask layer 504 and a resist layer 506, which has been patterned by a lithographic technique. The patterning resulted in an opening 508 in the resist layer 506 at a desired lateral position and with a desired critical lateral extension. The opening extends to a surface 510 of the mask layer 504. The mask layer is made of TiW in the present embodiment. However, other material choices are possible, which will be explained further below. The mask layer 504 has a thickness of less than 20% of the total thickness of the deposited layer structure formed by the mask layer and the tech layer.

Figure 6:
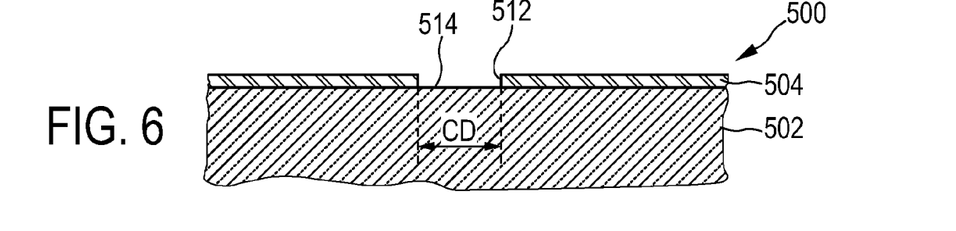

In subsequent processing steps, a mask opening 514 is formed by etching. The mask opening 514 has a desired critical lateral extension CD of a feature to be fabricated in an etch layer 516. The etch layer 516 is deposited in the next step on the mask layer 504 and also covers the mask opening 512. In the present example, the etch layer is made of Al. However, other material choices are possible, which will be explained further below.

Figure 7:
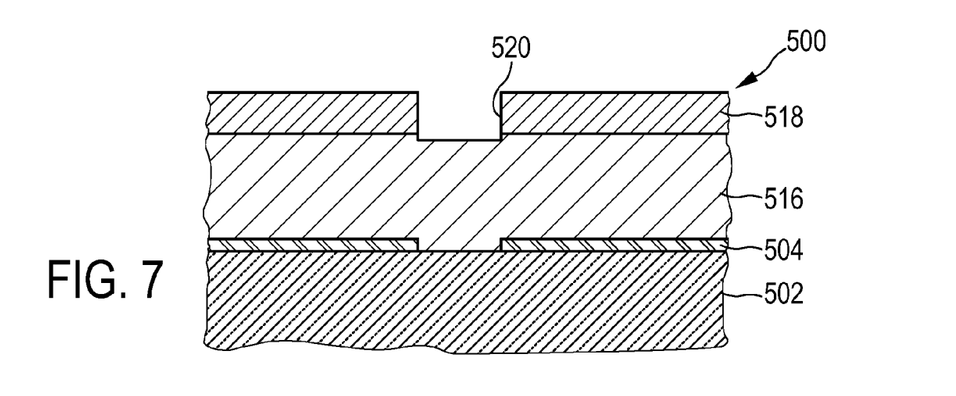
Figure 8:
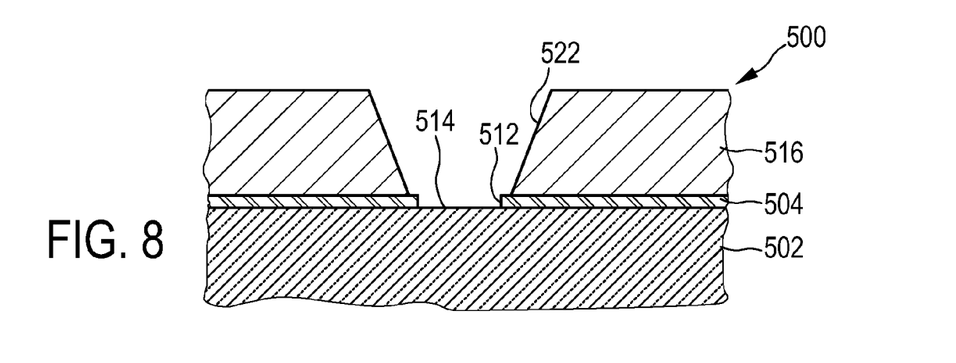

Subsequently, the etch layer is covered with a resist layer 518. The resist layer 518 is patterned by a process well known in the art to provide it with a resist opening 520 at the same lateral position as that of the currently covered mask opening 512 in the mask layer 504. The resist opening 520 also has the critical lateral extension CD of the mask opening 512.

After this, the etch layer 516 is selectively etched through the resist opening 520 by a plasma etch process or a wet etch process. A suitable etchant selectively attacks only the etch-layer material of the etch layer 516 and not the mask-layer material of the mask layer 504. An example of a suitable etchant is $H_3PO_4/HNO_3$ (aq). The choice of etchant depends on the selected combination of the etch-layer material and the mask-layer material. From another perspective, the etch-layer material and the mask-layer material should be selected in view of existing etchants for a selective etching process. Note that it is possible that the etch layer 516 and the mask layer 504 are of the same material, for example, of Al. A natural oxide layer on Al mask layer 504 forms an etch barrier if Al etch layer 516 is etched in an isotropic chlorine based plasma etch.

The etching process results in a desired feature of a funnel-shaped via, as has been described earlier for the embodiment of FIGS. 1 and 2. The resist layer 518 is stripped after the etching process. This results in the structure shown in FIG. 8, which has a feature in the form of a via 522 in the etch layer 516. By the presence of the mask layer 504 with the mask opening 512 of the critical lateral extension CD, a high reproducibility of the critical lateral extension at the bottom of other vias is achieved throughout the wafer 502, and also over different wafers. The presence of the TiW mask layer is also advantageous because it provides a smooth surface and the surface of the Al etch layer 516 is protected against roughening.

Figure 9:
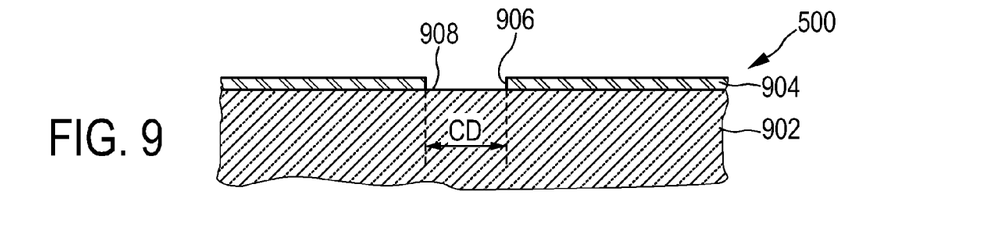
FIGS. 9 to 12 show a second embodiment of an etching method by cross-sectional views of a layer structure during different processing stages.

FIGS. 9 to 12 show a second embodiment of an etching method by cross-sectional views of a layer structure 900 during different processing stages. As is shown in FIG. 9, the layer structure 900 comprises a substrate layer, for instance a silicon wafer 902 and a mask layer 904. The mask layer is made of Al in the present embodiment. However, other material choices are possible, which will be explained further below. The processing preceding the stage shown in FIG. 9 corresponds to that described in the context of the previous embodiment with reference to FIGS. 5 and 6.

In fact, the processing stage of FIG. 9 corresponds to that of FIG. 6. A mask opening 906 has been fabricated with a desired critical lateral extension CD of a feature to be fabricated later in an etch layer 916. First, however, a sacrificial etch-stop cap 910 is fabricated that covers a surface section 908 of the substrate layer 902 in the opening 906. For this purpose, an etch-stop layer is deposited and patterned. After the patterning process, the etch-stop cap 910 remains. It has the shape of the letter T. The vertical bar of the T fills the mask opening 906, while outer sections of the horizontal bar of the T extend on the mask layer 904 in the neighborhood of the mask opening 906. The purpose of these sections is to protect the mask layer 904 from becoming attacked by the etchant that removes or attacks the etch-layer material. This is of particular importance if the mask-layer material is the same as the etch-layer material. The etch-stop cap 910 is in the present example made of $SiO_2$.

Figure 10:
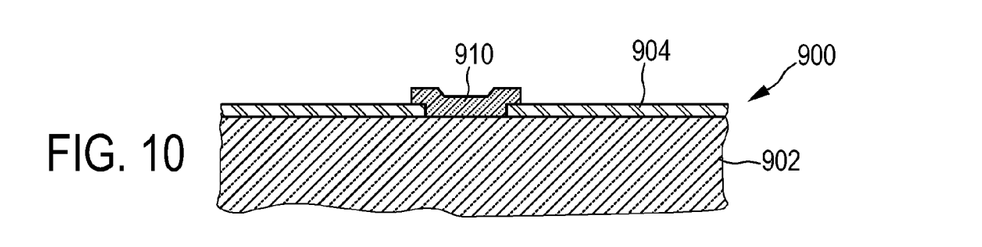

Subsequently, the etch layer 916 is deposited on the mask layer 904 and also on the etch-stop cap 910. In the present example, the etch layer is made of Al. However, other material choices are possible, which will be explained further below.

Figure 11:
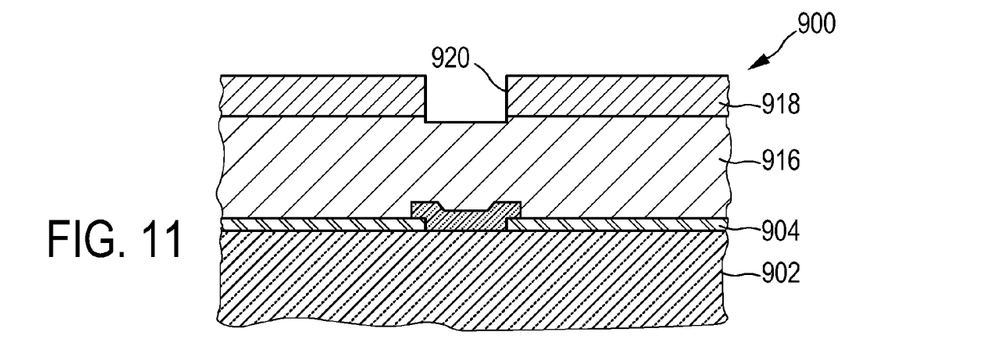

Subsequently, the etch layer 916 is covered with a resist layer 918. The resist layer 918 is patterned by a process well known in the art to provide it with a resist opening 920 at the same lateral position as that of the currently covered mask opening 906 in the mask layer 904. The resist opening 920 is only indicated schematically. Considerations regarding the lateral extension of the resist opening 920 will be explained in more detail below.

The lateral extension of the resist opening 920 depends on the specific parameters of the processed layer structure and the characteristics of the etching process. If an isotropic etch process is used, the lateral extension of the resist opening 920 is typically smaller than that of the opening 906 in the mask layer 904. Consequently, there is a lateral overlay difference between the resist opening 920 and the opening 906 in the mask layer 904. Care must be taken that the etching process, on one hand, exposes the surface etch-stop cap 910 and that, on the other hand, a lateral under-etching of the resist layer 918 does not reach beyond the lateral extension of the horizontal T-bar of the T-shaped etch-stop cap 910 and attack the mask layer 904.

The lateral overlay difference can be optimized using simulations of the etching process for a desired layer structure. One example employs a mask layer of Al with 1 micrometer thickness, an etch layer of Al with 4 micrometer thickness, and an etch-stop cap with a lateral overlap of 4 micrometer of its horizontal T-bar with the mask layer, and an isotropic etch process. In this example, the lateral overlay difference between the edge of the resist opening and the edge of the mask opening may suitably amount to for instance 3.2 micrometers on each edge. That means, the resist opening 920 has a lateral extension that is 6.4 micrometers smaller than the opening 906 in the mask layer 904.

After patterning the resist layer 918, the etch layer 916 is selectively etched in a first selective etching step through the resist opening 920 by a plasma etch process or a wet etch process. A suitable etchant selectively attacks only the etch-layer material of the etch layer 916 and not the etch-stop material of the etch-stop cap 910. An example of a suitable etchant is $H_3PO_4/HNO_3$ (aq). The choice of the etchant depends on the selected combination of the etch-layer material and the etch-stop material. From another perspective, the etch-layer material and the etch-stop material should be selected in view of existing etchants for a selective etching process, given, of course, the constraints of the desired layer structure for a particular application.

The first selective etching process results in a funnel-shaped via 922, as has been described earlier for the embodiment of FIGS. 5 to 9. The resist layer 918 is stripped after the first selective etching process. Subsequently, a second selective etching process is performed, which selectively removes the sacrificial etch-stop cap 910. $NH_4F/HF$ (aq) is a suitable etchant for the second selective etching step in this example. The shape of the etch-stop cap 910 results in small vertical sidewall sections 924 and 926 in the via 922.

Figure 12:
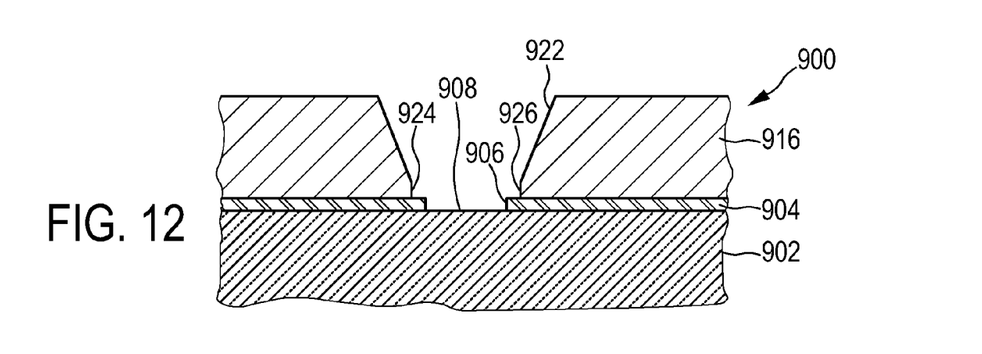

The resulting layer structure 900 of FIG. 12 shares the advantages of the embodiment of FIGS. 5 to 9. In addition, the layer structure 900 has the advantage of using the same material in the mask layer and in the etch layer. This avoids undesired mechanical stress and deformations that can occur in a structure that contains layers of different metals. Such stress can be caused by a difference in coefficients of thermal expansion of the different metals.

Figure 13:
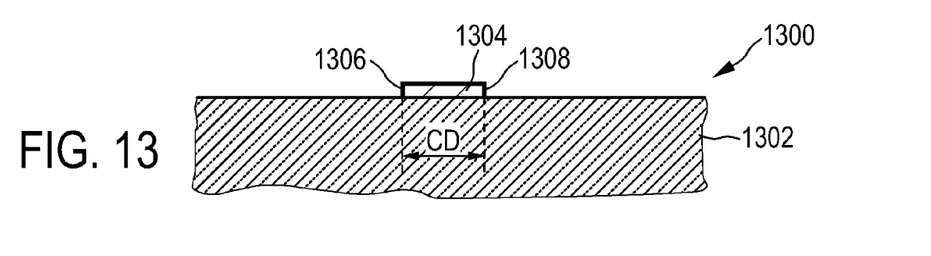
FIGS. 13 to 15 show a third embodiment of an etching method by cross-sectional views of a layer structure during different processing stages.
Figure 14:
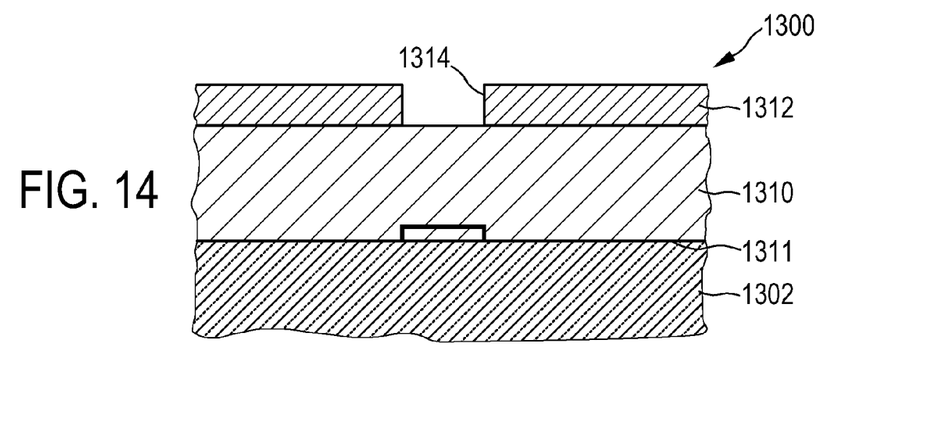
Figure 15:
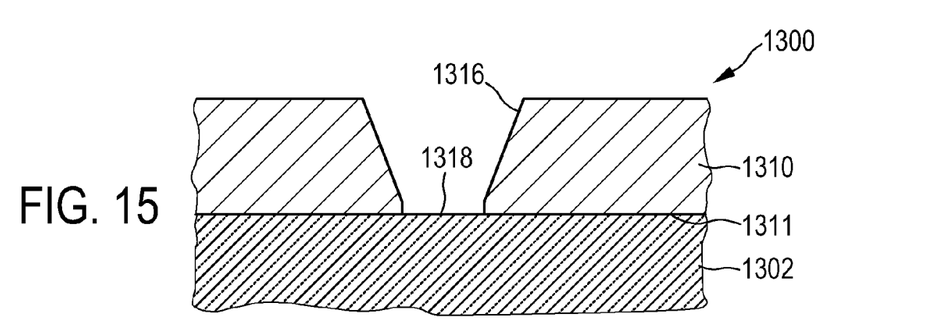

FIGS. 13 to 15 show a third embodiment of an etching method by cross-sectional views of a layer structure 1300 during different processing stages. At an intermediate processing stage shown in FIG. 13, the layer structure 1300 comprises a substrate layer, for instance a silicon wafer 1302, and a mask feature in the form of a capping segment 1304. The capping is made of Al in the present embodiment and is covered by a native aluminum oxide layer, which is indicated by a thicker outline of the capping segment in FIGS. 13 and 14. However, other material choices are possible, which will be explained further below. The processing preceding the stage shown in FIG. 13 comprises the deposition of and patterning of an Al mask layer on the wafer 1302 to form the capping segment 1304.

A mask feature in the form of a capping segment 1304 has been fabricated with a desired critical lateral extension CD between its lateral faces 1306 and 1308. The critical lateral extension CD is that of a desired feature to be fabricated later in an etch layer 1310.

The etch layer 1310 is deposited on the substrate layer 1302 and the capping segment 1304. In the present example, the etch layer is made of Al. However, other material choices are possible, which will be explained further below.

Subsequently, the etch layer 1310 is covered with a resist layer 1312. The resist layer 1312 is patterned by a process well known in the art to provide it with a resist opening 1314 at the same lateral position as that of the currently covered capping segment 1304. The resist opening 1314 also has the critical lateral extension CD of the capping segment 1304.

After this, the etch layer 1310 is selectively etched in a first selective etching step through the resist opening 1314 by a plasma etch process or a wet etch process. A suitable etchant selectively attacks only the etch-layer material of the etch layer 1310 and not the material of the mask feature, i.e., the capping segment 1304. The function of the capping segment 1304 thus corresponds to that of the etch-stop cap 910 of the previous embodiment. However, at the same time, the capping segment forms the mask feature that ensures the reliable reproduction of a feature with a critical lateral extension.

An example of a suitable etchant is $H_3PO_4/HNO_3$ (aq). The choice of the etchant depends on the selected combination of the etch-layer material and the material of the capping segment (the mask layer material). From another perspective, the etch-layer material and the etch-stop material should be selected in view of existing etchants for a selective etching process.

The first selective etching process results in a funnel-shaped via 1316, as has been described earlier for the embodiment of FIGS. 9 to 12. The resist layer 1312 is stripped after the first selective etching process. Subsequently, a second selective etching process is performed, which selectively removes the capping segment. $NH_4F/HF$ (aq) is a suitable etchant for the second selective etching step in this example.

The processing of the present embodiment has the advantage of requiring one lithographic mask step less that the embodiment of FIGS. 9 to 12. Still, it shares the advantages of the embodiment of FIGS. 9 to 12.

Figure 16:
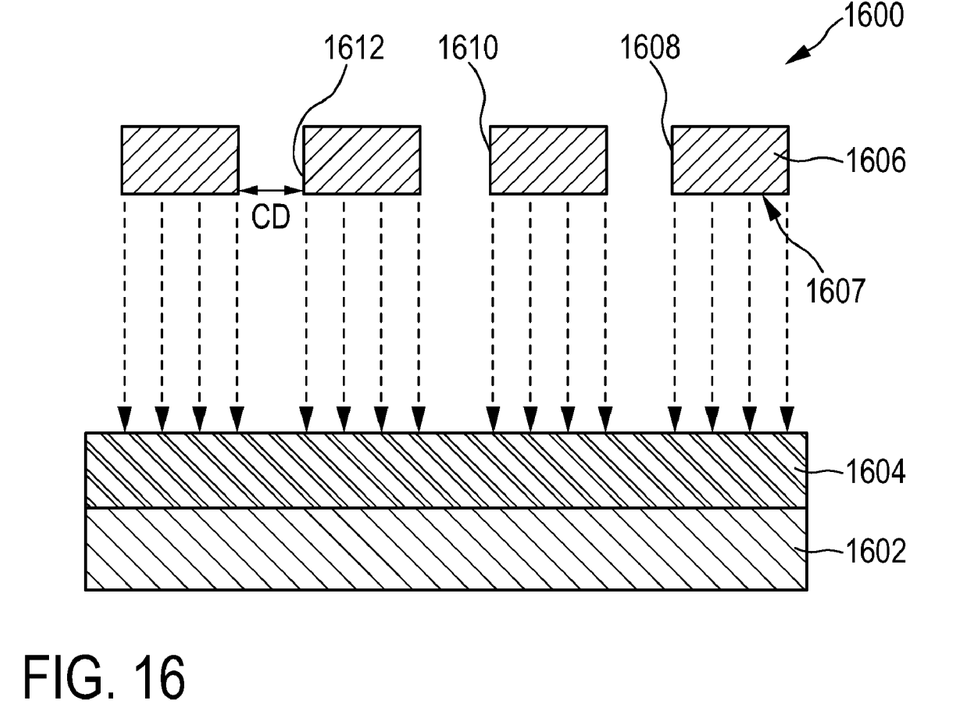
FIG. 16 shows a cross sectional view of a capacitive MEMS structure according to the method of the invention.

FIG. 16 shows a cross sectional view of a capacitive MEMS structure 1600 according to the method of the invention. The MEMS structure 1600 has a bottom electrode 1602, a dielectric layer 1604 and a top electrode 1606. The top electrode is made of a metal, for instance Al. It comprises holes 1608, 1610, 1612 that extend from a top surface of the top electrode to its bottom surface 1607. The holes have a critical lateral extension CD, shown by way of example for the hole 1612.

The top electrode of the MEMS structure 1600 has been fabricated by a process according to one of the processing embodiments according to FIGS. 9 to 12 or 13 to 15 of the method of the invention described herein. The top electrode 1606 corresponds to the etch layer of the previous embodiments. In addition, the substrate layer has been removed after the formation of the holes 1608, 1610, 1612, which have been fabricated as the features in the etch layer in the processing according to the method of the invention. Electric field lines are indicated by arrows extending between the top and bottom electrodes.

The MEMS structure 1600 has holes with a precisely reproduced critical lateral extension CD at the bottom face 1607 of the top electrode 1606. This ensures an accurate and reproducible capacitance value of the MEMS structure in different MEMS structures formed on the same wafer, and in different MEMS structures formed in different wafers. For the capacity of the MEMS structure is influenced by the total area of the bottom face 1607 of the top electrode 1606. Since the critical lateral extensions of the holes 1608, 1610, 1612 are well reproducible, no variations of the capacity will be observed in different MEMS devices fabricated by the process of the invention.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

Any reference signs in the claims should not be construed as limiting the scope.

What is claimed is:

1. A method for etching a feature in an etch layer, the method comprising:
providing a substrate layer;
fabricating a mask feature from a mask layer material, the mask feature being fabricated at a lateral feature position on the substrate layer, the mask feature having a critical lateral extension, wherein fabricating the mask feature comprises fabricating a mask opening in a mask layer on the substrate layer at the lateral feature position and with the critical lateral extension and wherein the mask layer comprises TiW or Al with an aluminum oxide cover layer;
depositing an etch layer from an etch layer material on the mask feature and on the substrate layer, the etch layer being deposited to a thickness of more than 2 micrometers from an initial contact face, the etch layer material being selectively etchable relative to the mask layer material, wherein the etch layer comprises Al; and
etching a feature in the etch layer at a first lateral position with a lateral extension larger than the critical lateral extension, the etching using an etchant that selectively removes the etch layer material relative to the mask layer material.

2. The method of claim 1, wherein
fabricating the mask feature comprises fabricating a sacrificial etch-stop cap from an etch-stop material in the mask opening, the etch-stop material being selectively etchable relative to the mask layer material and the etch layer material;
the etch layer material is additionally selectively etchable relative to the etch-stop material; and
etching the feature in the etch layer comprises performing a first selective etching step during which the etch layer is removed selectively relative to the etch-stop cap, and performing a second selective etching step during which the etch-stop cap is removed selectively relative to the etch layer and to the mask layer.

3. The method of claim 2, wherein the etch-stop cap is T-shaped.

4. The method of claim 2, wherein the etch layer material comprises a metal and the etch-stop material is non-metallic.

5. The method of claim 2, wherein the etch layer material comprises Al and the etch-stop material comprises $SiO_2$.

6. The method of claim 2, wherein the first selective etching step uses $H_3PO_4/HNO_3$(aq.) and wherein the second selective etching step uses $NH_4F/HF$ (aq.).

7. The method of claim 1, wherein
fabricating the mask feature comprises removing those mask layer sections that are arranged outside the critical lateral extension at the lateral feature position, and
etching the feature in the etch layer comprises performing a first selective etching step during which the etch layer is removed selectively relative to the mask feature and performing a second selective etching step during which the mask feature is removed selectively relative to the etch layer.

8. The method of claim 7, wherein the mask layer sections are removed from a mask layer on the substrate layer.

9. The method of claim 7, wherein the first selective etching step uses $H_3PO_4/HNO_3$(aq.) and wherein the second selective etching step uses $NH_4F/HF$ (aq.).

10. The method of claim 1, wherein fabricating the mask feature comprises depositing a mask layer on the substrate layer and structuring the mask layer with a lithographic process to form the mask feature.

11. The method of claim 1, wherein etching the feature in the etch layer is performed with the aid of a lithographic process.

12. The method of claim 1, further comprising removing the substrate layer relative to the etch layer after etching the feature in the etch layer.

13. The method of claim 1, wherein etching comprises etching to an opposite bottom face of the etch layer.

14. A method for etching a feature in an etch layer, the method comprising:
providing a substrate layer;
fabricating a mask feature from a mask layer material, the mask feature being fabricated at a lateral feature position on the substrate layer, the mask feature having a critical lateral extension, wherein fabricating the mask feature comprises fabricating a mask opening in a mask layer on the substrate layer at the lateral feature position and with the critical lateral extension;
depositing an etch layer from an etch layer material on the mask feature and on the substrate layer, the etch layer being deposited to a thickness of more than 2 micrometers from an initial contact face, the etch layer material being selectively etchable relative to the mask layer material; and etching a feature in the etch layer at a first lateral position with a lateral extension larger than the critical lateral extension, the etching using an etchant that selectively removes the etch layer material relative to the mask layer material;

wherein fabricating the mask feature comprises fabricating a sacrificial etch-stop cap from an etch-stop material in the mask opening, the etch-stop material being selectively etchable relative to the mask layer material and the etch layer material;

wherein the etch layer material is additionally selectively etchable relative to the etch-stop material; and wherein etching the feature in the etch layer comprises performing a first selective etching step during which the etch layer is removed selectively relative to the etch-stop cap, and performing a second selective etching step during which the etch-stop cap is removed selectively relative to the etch layer and to the mask layer.

15. The method of claim 14, wherein the etch-stop cap is T-shaped.

16. The method of claim 14, wherein the etch layer material comprises Al and the etch-stop material comprises $SiO_2$.

17. A method for etching a feature in an etch layer, the method comprising:

providing a substrate layer;

fabricating a mask feature from a mask layer material, the mask feature being fabricated at a lateral feature position on the substrate layer, the mask feature having a critical lateral extension;

depositing an etch layer from an etch layer material on the mask feature and on the substrate layer, the etch layer being deposited to a thickness of more than 2 micrometers from an initial contact face, the etch layer material being selectively etchable relative to the mask layer material; and etching a feature in the etch layer at a first lateral position with a lateral extension larger than the critical lateral extension, the etching using an etchant that selectively removes the etch layer material relative to the mask layer material;

wherein fabricating the mask feature comprises removing those mask layer sections that are arranged outside the critical lateral extension at the lateral feature position; and wherein etching the feature in the etch layer comprises performing a first selective etching step during which the etch layer is removed selectively relative to the mask feature and performing a second selective etching step during which the mask feature is removed selectively relative to the etch layer.

18. The method of claim 17, wherein the mask layer sections are removed from a mask layer on the substrate layer.

19. The method of claim 17, wherein the first selective etching step uses $H_3PO_4/HNO_3$ (aq.) and wherein the second selective etching step uses $NH_4F/HF$ (aq.).

20. A method for etching a feature in an etch layer, the method comprising:

providing a substrate layer;

fabricating a mask feature from a mask layer material, the mask feature being fabricated at a lateral feature position on the substrate layer, the mask feature having a critical lateral extension;

depositing an etch layer from an etch layer material on the mask feature and on the substrate layer, the etch layer being deposited to a thickness of more than 2 micrometers from an initial contact face, the etch layer material being selectively etchable relative to the mask layer material;

etching a feature in the etch layer at a first lateral position with a lateral extension larger than the critical lateral extension, the etching using an etchant that selectively removes the etch layer material relative to the mask layer material; and removing the substrate layer relative to the etch layer after etching the feature in the etch layer.

* * * * *